(12) United States Patent
Pang et al.

(10) Patent No.: US 7,485,563 B2
(45) Date of Patent: Feb. 3, 2009

(54) METHOD OF PROVIDING SOLDER BUMPS OF MIXED SIZES ON A SUBSTRATE USING A SORTING MASK AND BUMPED SUBSTRATE FORMED ACCORDING TO THE METHOD

(75) Inventors: Mengzhi Pang, Phoenix, AZ (US); John Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 11/478,751

(22) Filed: Jun. 29, 2006

(65) Prior Publication Data

US 2008/0003802 A1 Jan. 3, 2008

(51) Int. Cl.
*H01L 21/44* (2006.01)
(52) U.S. Cl. .................. 438/613; 438/612; 257/738; 257/779; 257/780
(58) Field of Classification Search ............ 438/612, 438/613; 257/734, 755, 737, 738, 778, 779, 257/780
See application file for complete search history.

(56) References Cited

U.S. PATENT DOCUMENTS

| 5,749,614 | A | 5/1998 | Reid |
| 5,985,694 | A | 11/1999 | Cho |
| 6,415,974 | B2 * | 7/2002 | Jao ............................ 228/215 |
| 6,586,844 | B1 * | 7/2003 | Chang ......................... 257/779 |
| 6,890,844 | B2 * | 5/2005 | Farnworth .................. 438/612 |
| 6,916,687 | B2 * | 7/2005 | Ho et al. ..................... 438/120 |
| 7,112,888 | B2 * | 9/2006 | Kuramoto et al. ........... 257/780 |
| 2004/0127010 | A1 * | 7/2004 | Chen et al. .................. 438/612 |
| 2007/0069346 | A1 * | 3/2007 | Lin et al. ..................... 257/673 |
| 2007/0234563 | A1 * | 10/2007 | Sakaguchi et al. ............ 29/843 |
| 2008/0003805 | A1 * | 1/2008 | Pang et al. .................. 438/613 |

OTHER PUBLICATIONS

Hitachi Metals Ltd., "Press Release: Manual Micro-ball Mounter Developed", retrieved from http://hitachi-metals.co.jp/e/press/news/2005/n0928.htm, Sep. 28, 2005, 1-6.
USPTO, "Non-Final Office Action," U.S. Appl. Ser. No. 11/479,625 (42P24432), mailed Apr. 22, 2008 1-9.

* cited by examiner

*Primary Examiner*—Ha Tran T Nguyen
*Assistant Examiner*—Daniel Whalen
(74) *Attorney, Agent, or Firm*—Blakely, Sokoloff, Taylor & Zafman LLP

(57) ABSTRACT

A method of providing electrically conductive bumps on electrode pads of a microelectronic substrate, and bumped substrate formed according to the method. The method includes: providing a microelectronic substrate including electrode pads; providing a sorting mask defining first openings and second openings therethrough, the second openings being larger than the first openings; disposing the mask onto the substrate such that the first openings and second openings register with respective ones of the electrode pads; providing first solder portions onto corresponding ones of the electrode pads through the first openings, and second solder portions onto corresponding ones of the electrode pads through the second openings, the second solder portions being larger than the first solder portions; reflowing the solder portions to form, respectively first solder bumps and second solder bumps on respective ones of the electrode pads; and removing the mask after providing solder portions and before reflowing.

11 Claims, 4 Drawing Sheets

METHOD OF PROVIDING SOLDER BUMPS OF MIXED SIZES ON A SUBSTRATE USING A SORTING MASK AND BUMPED SUBSTRATE FORMED ACCORDING TO THE METHOD

FIELD

Embodiments of the present invention relate generally to solder bump forming methods and solder bump forming apparatus for forming solder bumps on electrode pads.

BACKGROUND

There are a number of solder bump forming methods according to the prior art. According to a plating method, metal is deposited on electrode pads of a microelectronic substrate through plating to form bumps. In another method typically referred to as a stencil printing method, solder paste, typically including flux, is printed onto electrode pads of a microelectronic substrate through a patterned stencil, and then, after stencil removal, the device is heated to melt the solder to form bumps therefrom. Stencil printing is sometimes used by the prior art to deposit differing amounts of solder paste onto the electrode pads of a substrate as a function of a size of the solder resist opening on each of the electrode pads. Thus, the prior art sometimes uses a stencil mask exhibiting larger openings in registration with larger solder resist openings of the substrate, and smaller openings in registration with larger solder resist openings of the substrate, in this way depositing a corresponding amount of solder paste onto each electrode pad. However, it has been observed that the stencil printing method is not suited for high density interconnection structures, typically leading to missing bump rates, bump voiding, and bump height variation, thus negatively affecting die attachment yields.

Different techniques have been introduced to address ever growing demands for pitch and solder resist openings (SRO) size reductions, such as pitches of about 160 microns and SRO sizes of about 80 to 90 microns. One such method involves the placement of micro balls or micro spheres of solder onto the electrode pads of a microelectronic substrate. According to an attachment mounting micro ball placement method, solder balls are sucked into a jig by vacuum suction and the solder balls then mounted onto flux-coated electrode pads of a microelectronic substrate. Another micro ball placement method involves the use of a stencil mask. According to the latter methods, solder balls of a uniform size are dispensed onto a ball alignment plate or stencil mask including holes therein in registration with electrode pads of a microelectronic substrate. A squeegee brush is then used to disperse the balls and press them into the mask holes. The electrode pads include flux thereon, which allows the balls to adhere thereto. The stencil mask is removed after ball placement. The solder balls are then heated and melted to form bumps.

The prior art poses problems however, among others where bumps are to be provided on a substrate having electrode pads and/or solder resist openings of differing sizes. A micro ball placement method, such as the attachment mounting method or the stencil mask method described above, typically results in solder bumps exhibiting significant bump height variations from bump to bump depending on the size of the electrode pad and/or solder resist opening used.

The prior art fails to provide a reliable method of providing solder bumps on electrode pads and/or solder resist openings of differing sizes on a microelectronic substrate.

Figure 1:
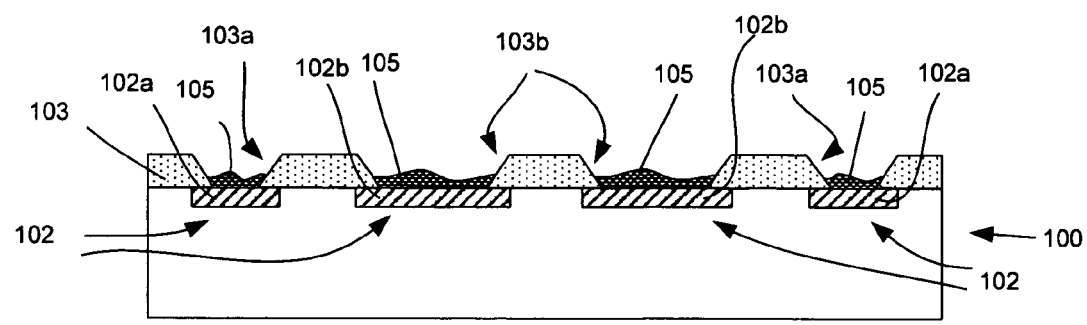
FIG. 1 is a schematic cross-sectional view of a substrate adapted to be provided with solder bumps according to a method embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of providing solder bumps onto a microelectronic substrate is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a method of placing solder bumps on electrode pads of a microelectronic substrate is disclosed. In another embodiment, a bumped microelectronic substrate is disclosed. By "electrode pads," what is meant in the context of the instant description are bumping sites on a microelectronic substrate, such as under-bump metallization layers or "surface finish" layers, which allow the device to be electrically connected to other devices. Aspects of this and other embodiments will be discussed herein with respect to FIGS. 1-8, below. The figures, however, should not be taken to be limiting, as they are intended for the purpose of explanation and understanding.

Referring first to FIG. 1 by way of example, a method embodiment comprises providing a microelectronic substrate including electrode pads thereon. By "microelectronic substrate," what is meant in the context of the instant description is a substrate onto which microelectronic conductive patterns have been provided. The substrate may include either the substrate of a completed microelectronic device, or a substrate adapted to be further processed to form a microelectronic device, or a substrate, such as a printed wiring board, including conductive patterns adapted to provide interconnection between microelectronic components. For example the substrate can be an organic build-up substrate, a ceramic substrate, or a semiconductor substrate, such as a silicon substrate of a microelectronic die. As seen in FIG. 1, a method embodiment comprises providing a microelectronic substrate 100 including electrode pads 102 thereon. In the shown embodiments, the electrode pads 102 include first electrode pads 102a and second electrode pads 102b, wherein the second electrode pads 102b are larger than the first electrode pads 102a. The substrate 100 therefore exhibits a mixed pad size configuration. It is noted however, that embodiments are not limited to the use of a substrate having electrode pads of differing sizes, and includes within its scope a substrate having electrode pads of a substantially uniform size. Additionally, the pads may be set at differing or mixed pitches with respect to one another, or at a constant pitch, according to application needs. In the shown embodiment, pads 102 are set at mixed pitches with respect to one another. The electrode pads 102 may include any well known type of surface finish on the substrate, such as, for example, under bump metallization including layers of gold and nickel as would be within the knowledge of a person skilled in the art. According to one embodiment, the substrate may include a solder resist layer 103 thereon. The solder resist layer 103 (also called a "solder mask" or "stop-off") is an insulating layer that is patterned with holes according to a pattern of the electrode pads. The solder resist may include a heat-resisting coating material applied to specific areas on the surface of a substrate, and is provided mainly as a protective film for the conductive patterns of the substrate. According to an embodiment, solder resist layer 103 may include a mixture of an epoxy resin and an acrylic resin, and may be coated onto the substrate in a well known manner. As shown, solder resist layer 103 may define first solder resist openings 103a therethrough placed in registration with corresponding ones of the electrode pads 102a, and second solder resist openings 103b therethrough placed in registration with corresponding ones of the electrode pads 102b. As shown, solder resist openings 103b are larger than solder resist openings 103a. The solder resist layer 103 in the shown embodiment therefore defines mixed solder resist openings therethrough, that is, solder resist openings of mixed sizes. It is noted that embodiments are not limited to the use of a substrate including a solder resist thereon, and include within their scope a processing of a substrate free of a solder resist layer. In the shown embodiment of FIG. 1, flux 105 is additionally shown as having been provided onto the electrode pads. The flux may include a flux having relatively high tackiness, and may be applied onto the pads in any well known manner, such as, for example, by way of stencil printing through a stencil mask (not shown).

Figure 2:
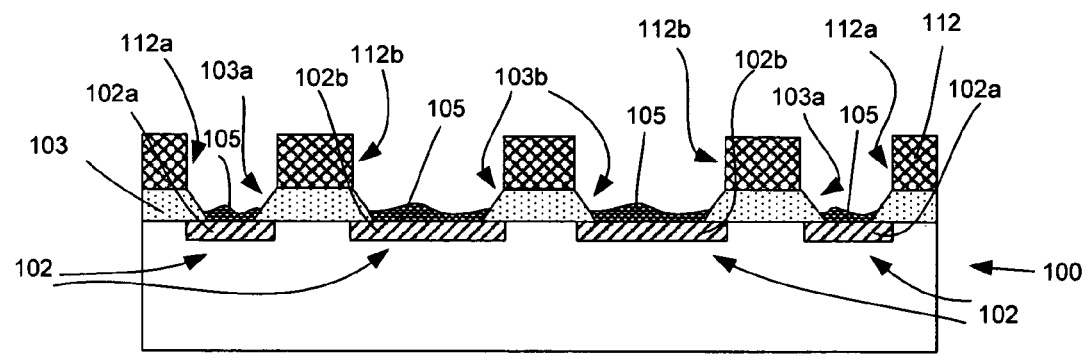
FIG. 2 is a schematic view showing the substrate of FIG. 1 as having been provided with a sorter mask thereon according to a method embodiment.

Referring next to FIG. 2 by way of example, embodiments contemplate providing a sorting mask 112 and disposing the sorting mask onto the substrate 100 such that first openings 112a and second openings 112b defined in the mask are placed in registration with the electrode pads 102, the second openings being larger than the first openings. In addition, according to the shown embodiment, the first openings 112a and the second openings 112b are set at mixed pitches with respect to one another. The mask may include any suitable material as would be within the knowledge of a skilled person, such as, for example, a metal mask or a mask made of an organic material. In the shown embodiment of FIG. 2, the sorter mask 112 is shown as having been placed onto the solder resist layer 103 of substrate 100, the first openings 112a of the mask 112 registering with the first openings 103a of the solder resist layer 103, and the second openings 112b of the mask 112 registering with the second openings 103b of the solder resist layer 103b. The mask may be placed onto the substrate in any well known manner. However, embodiments within their scope the use of a sorter mask provided directly onto a substrate body without the intermediary of a solder resist layer.

Figure 3:
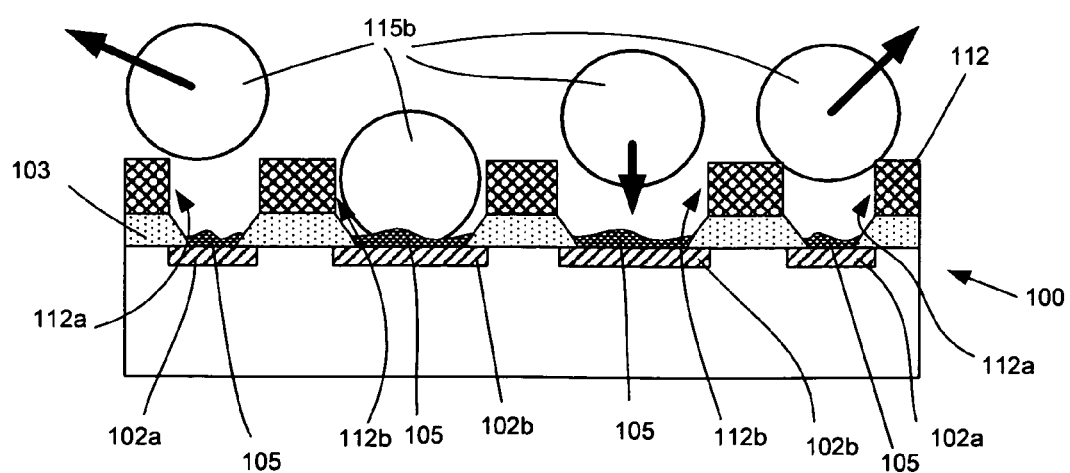
FIGS. 3 and 4 are schematic views showing solder balls of mixed sizes in the process of being provided onto the substrate and mask combination of FIG. 2 according to a method embodiment.
Figure 4:
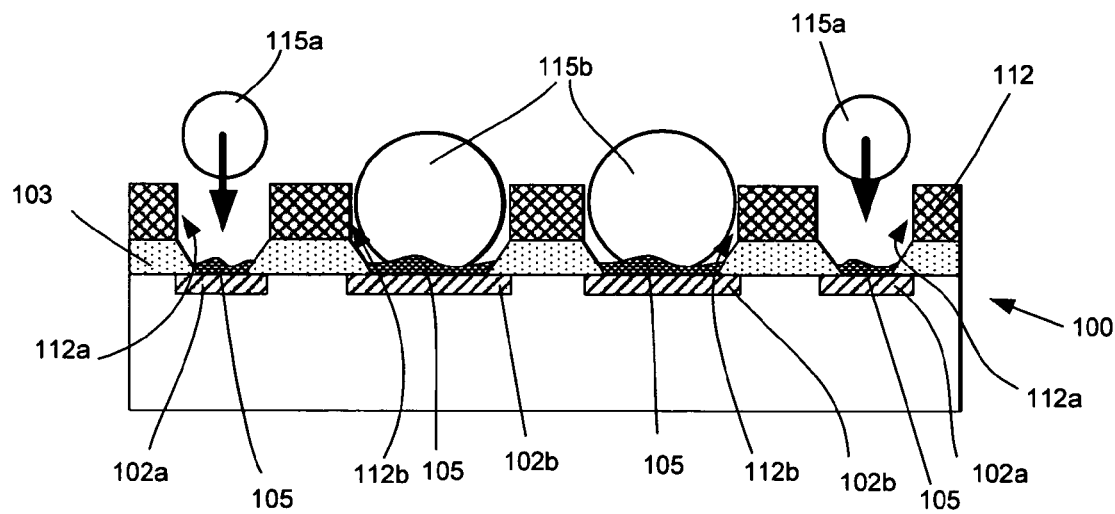

Referring next to FIGS. 3 and 4 by way of example, a method embodiment comprises providing solder portions onto the electrode pads through the mask openings. Thus, in the shown embodiment, after placement of the mask 112 onto substrate 100 such that openings 112a and 112b register with electrode pads 102a and 102b, respectively, first solder portions in the form of first solder balls 115a, and second solder portions in the form of second solder balls 115b, may be provided onto respective ones of the electrode pads 102a and 102b. In the shown embodiment, providing solder portions occurs sequentially, that is, second solder balls 115b (larger), are initially provided onto the second electrode pads 102b, and the first solder balls 115a (smaller), are thereafter provided onto the first electrode pads 102a. Providing solder balls of mixed sizes onto the sorter mask simultaneously without further precautions may have the negative effect of smaller balls lodging themselves in the larger mask openings corresponding to the larger balls. Preferably, an embodiment comprises selecting respective sizes of the first solder portions and the second solder portions to achieve first solder bumps and second solder bumps having respective predetermined bump heights. Thus, for example, according to an embodiment, a size of first solder balls 115a and a size of second solder balls 115b may be selected such that, after reflow, bumps resulting from first solder balls 115a have a first predetermined bump height, and bumps resulting from second solder balls 115b have a second predetermined bump height. Most preferably, as suggested by FIG. 4 (to be discussed infra), the size of first solder balls 115a and the size of second solder balls 115b is selected such that bumps resulting from respective ones of the solder balls 115a and 115b have substantially identical bump heights, that is, such that the first and second predetermined bump heights are substantially identical. A correlation between solder ball size and bump height may, for example, be empirically determined for a given solder resist opening size and configuration. For example, for a given solder resist opening size and configuration, an observation may be made as to a correlation between the respective solder bumps obtained from solder balls of differing sizes. In this way, a determination may be made as to a target solder ball size adapted to generate a solder bump of a desired height for a given solder resist opening size and configuration.

Referring back to FIGS. 3 and 4, the solder balls 115a and 115b may, according to some embodiments, be provided into openings 112a and 112b, respectively, of mask 112 in a number of different ways. The sorter mask, by virtue of having openings of mixed sizes, helps to sort the balls according to their size into respective ones of the mask openings. Thus, sorter mask 112, as shown in FIGS. 3 and 4, initially sorts solder balls 115a into mask openings 112a based on the relative sizes of the solder balls 115a and openings 112a, and thereafter sorts solder balls 115b into mask openings 112b based on the relatives sizes of the solder balls 115b and openings 112b. As noted above, preferably, as shown in the embodiment of FIGS. 3 and 4, the second solder balls 115b may be provided during a first time period, and the first solder balls 115a during a second time period different from the first time period. That is, the first and second solder balls may be provided sequentially. According to one embodiment, the balls may be helped into corresponding ones of the openings of the sorting mask in various ways as would be recognized by one skilled in the art, such as, for example, through the use of a ball transfer brush or squeegee brush, which may be used to disperse the balls 115a and 115b while at the same time pressing them into corresponding ones of the openings 112a and 112b. Optionally, providing solder balls such as solder balls 115a and 115b may comprise vibrating the substrate 100 including mask 112 thereon in a well known manner during ball placement in order to facilitate a placement of respective ones of the balls 115a and 115b onto corresponding ones of the electrode pads 102a and 102b through respective openings 112a and 112b.

Figure 5:
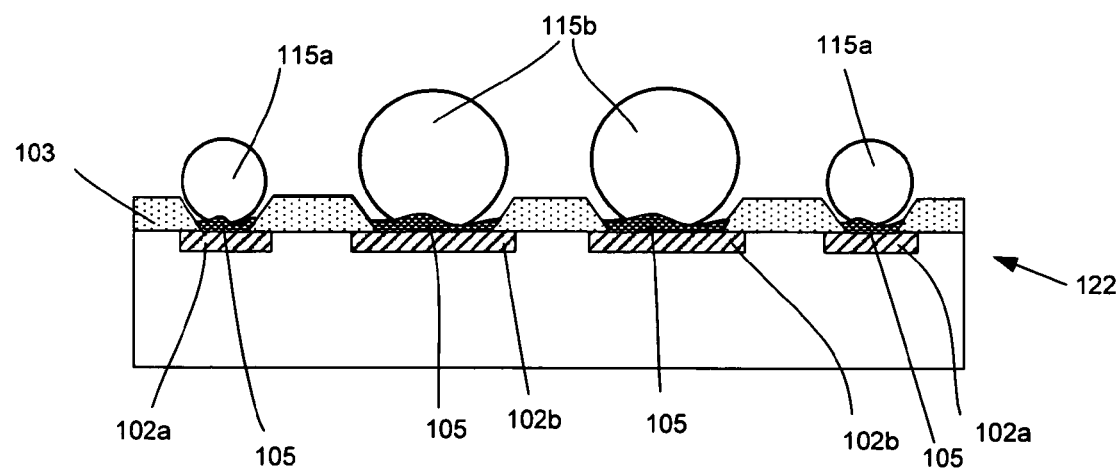
FIG. 5 is a schematic view showing an intermediate structure as having been formed by removing the mask from the substrate and mask combination of FIG. 4 after solder ball placement according to a method embodiment.

Referring now to FIG. 5 by way of example, method embodiments comprise removing the sorter mask, such as mask 112, from the substrate after providing the solder portions and before reflowing. Thus, as depicted in FIG. 5, after ball placement onto electrode pads 102a and 102b, the sorter mask 112 may be removed, the flux 105 helping the balls 115a and 115b adhere to the pads 102a and 102b, respectively. A placement of the solder portions, such as solder balls 115a and 115b, onto electrode pads 102a and 102b, respectively, for example according to FIGS. 3 and 4, and a subsequent removal of the mask, such as mask 112, before reflow results in the formation of an intermediate structure, such as, for example, intermediate structure 122 as shown in FIG. 5.

Figure 6:
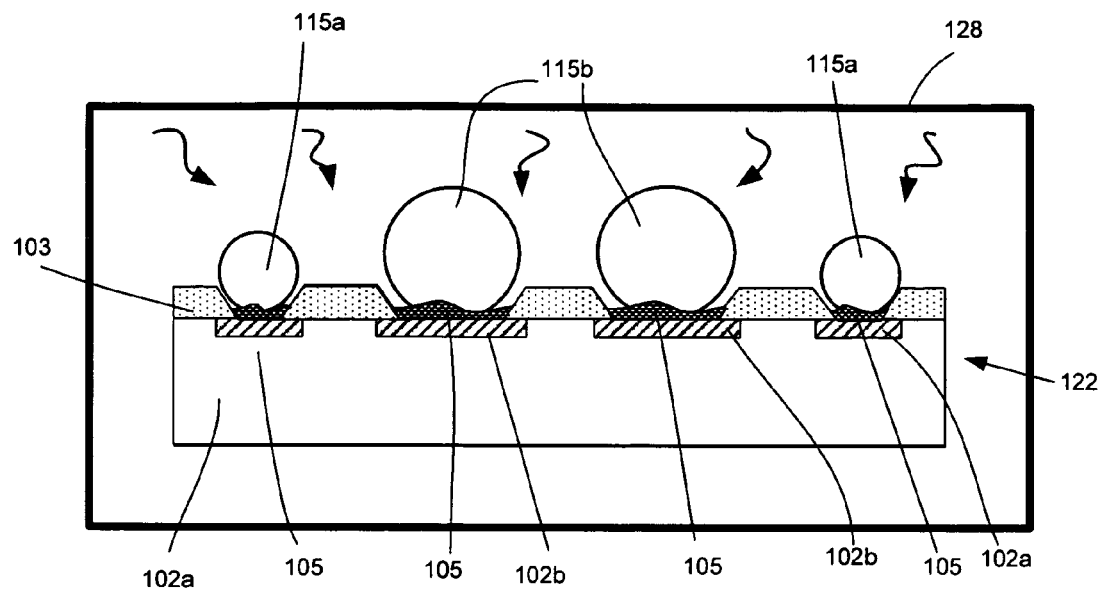
FIG. 6 is a schematic view showing the intermediate structure of FIG. 5 as undergoing reflow according to a method embodiment.

Referring now to FIG. 6 by way of example, embodiments include reflowing the solder portions to form solder bumps on respective ones of the electrode pads. Thus, as seen in FIG. 6, the intermediate structure 122 may be placed in a reflow oven 128 as shown. The reflow may take place at reflow temperatures suitable for the intermediate structure 122 and for the solder balls 115a and 115b, as would be recognizable to one skilled in the art. According to an embodiment, reflow may take place at temperatures above about 250 degrees Centigrade. The 250 degrees Centigrade minimum reflow temperature would for example apply to solder balls comprising a SnAg or a SnAgCu alloy. The SnAg may comprise less than about 4% by weight Ag, while the SnAgCu may comprise less than about 1% by weight Cu and less than about 4% by weight Ag.

Figure 7:
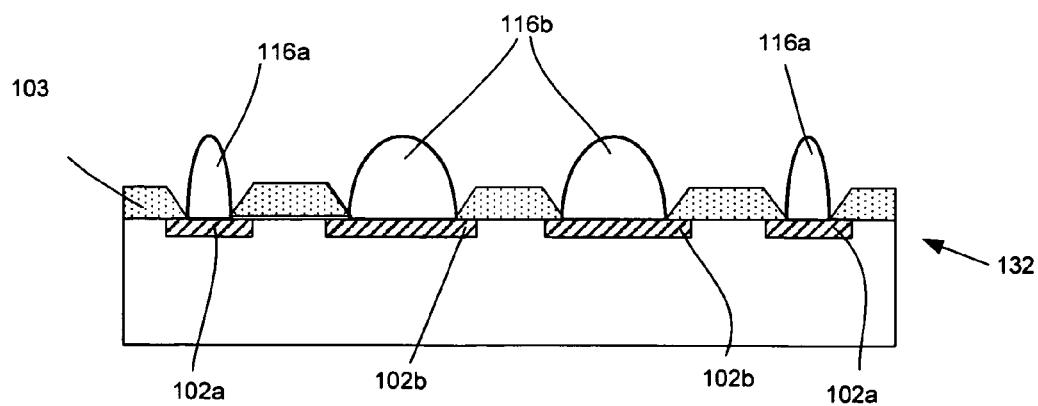
FIG. 7 is a schematic view of a bumped microelectronic substrate according to an embodiment.

As seen in FIG. 7, a reflowing of the intermediate package 122 of FIG. 5 as shown in FIG. 6 results in the formation of solder bumps 116a and 116b, corresponding to balls 115a and 115b, respectively, onto electrode pads 102a and 102b of substrate 100, yielding a solder-bumped substrate 132 as shown. In the shown embodiment, the solder-bumped substrate 132 includes the plurality of electrode pads 102a and 102b, first solder bumps 116a and second solder bumps 116b on corresponding ones of the electrode pads 102a and 102b, bumps 116b being larger than bumps 116a, and bumps 116a and 116b having substantially identical heights. Solder bumps have "substantially identical heights" as described therein where their respective heights are within bump height variation tolerances according to application needs. Thus, a given application may specify a requirement for substrates having bump heights of 30 microns with tolerances of +/−15 microns. In such a case, solder bumps as described herein would have "substantially identical heights" where their heights would range from between 15 microns up to 45 microns. In the alternative, if the tolerances specified were +/−5 microns, then, solder bumps as described herein would have "substantially identical heights" where their heights would range from between 25 microns and 35 microns. The bumped substrate 132 as shown further includes the solder resist layer 103 thereon, although, as noted previously, embodiments are not limited to the use of a substrate including a solder resist layer.

Advantageously, method embodiments allow for a more precise solder bump volume and height control by virtue of allowing a placement of mixed size solder portions onto electrode pads of a substrate. The more precise bump volume and height control allows a more reliable formation of solder joints during chip attachment, and thus results in a significantly lower amount of solder voids, missing bumps and resulting electromigration issues as compared with the prior art.

Figure 8:
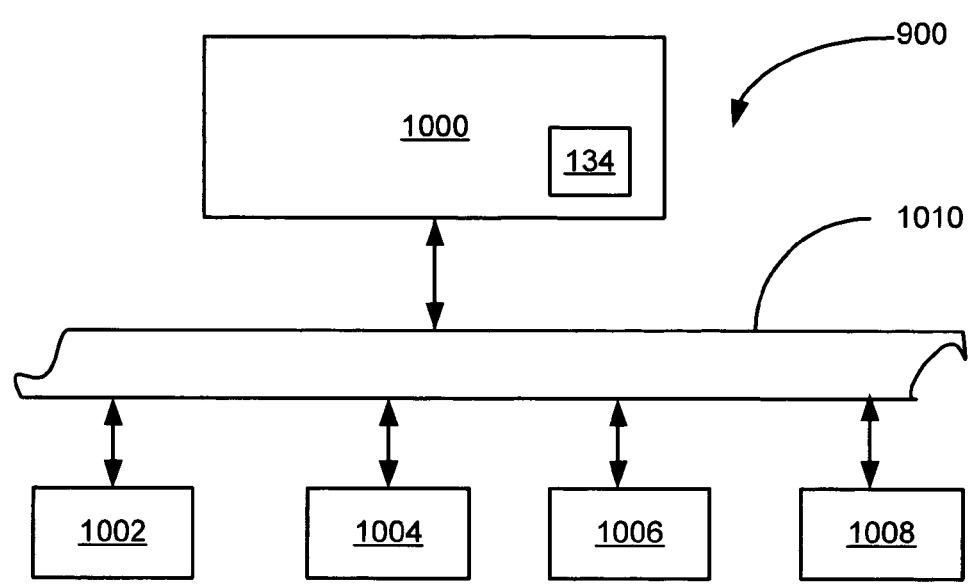
FIG. 8 is a schematic view of a system including a bumped microelectronic substrate according to an embodiment.

Referring to FIG. 8, there is illustrated one of many possible systems 900 in which embodiments of the present invention may be used. In one embodiment, the electronic assembly 1000 may include a microelectronic package 134 including a solder-bumped substrate, such as substrate 132 of FIG. 7. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 8, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of providing electrically conductive bumps on electrode pads of a microelectronic substrate comprising:
   providing a microelectronic substrate including electrode pads thereon;
   providing a sorting mask defining first openings and second openings therethrough, the second openings being larger than the first openings;
   disposing the mask onto the substrate such that the first openings and second openings register with respective ones of the electrodes pads;
   providing first solder portions onto corresponding ones of the electrode pads through the first openings, and second solder portions onto corresponding ones of the electrode pads through the second openings, the second solder portions being larger than the first solder portions and too large to be provided through the first openings, wherein the second solder portions are provided through the second openings prior to providing the first solder portions through the first openings;

reflowing the first solder portions and second solder portions to form, respectively, first solder bumps and second solder bumps on respective ones of the electrode pads; and removing the mask after providing solder portions and before reflowing.

2. The method of claim 1, wherein the electrode pads comprise first electrode pads and second electrode pads, the second electrode pads being larger than the first electrode pads, disposing comprising registering the first openings with the first electrode pads, and registering the second openings with the second electrode pads.

3. The method of claim 1, further comprising, prior to providing the first solder portions and the second solder portions, adding flux to the electrode pads.

4. The method of claim 3, wherein adding flux comprises adding flux through a stencil mask.

5. The method of claim 1, wherein the mask comprises one of a metallic and an organic material.

6. The method of claim 1, wherein the first openings and the second openings are set at differing pitches with respect to one another.

7. The method of claim 1, wherein the first solder portions and the second solder portions comprise solder balls.

8. The method of claim 1, wherein providing the first solder portions and the second solder portions comprise at least one of using a squeegee brush and vibrating the substrate to contribute to an insertion of the first solder portion and the second solder portions into the respective mask openings.

9. The method of claim 1, wherein:

the substrate comprises a solder resist layer thereon, the solder resist layer defining first solder resist openings therethrough placed in registration with corresponding ones of the electrode pads, and second solder resist openings therethrough placed in registration with corresponding ones of the electrode pads, the second solder resist openings being larger than the first solder resist openings;

disposing the mask comprises disposing the mask onto the solder resist layer.

10. The method of claim 1, wherein providing the first solder portions and the second solder portions comprises selecting respective sizes of the first solder portions and the second solder portions to achieve first solder bumps and second solder bumps having respective predetermined bump heights.

11. The method of claim 1, wherein the respective predetermined bump heights are substantially identical heights.

\* \* \* \* \*